United States Patent [19]
Cases et al.

[11] Patent Number: 5,905,618
[45] Date of Patent: May 18, 1999

[54] VOLTAGE PROTECTED LEVEL SHIFTING OF CHIP DRIVER

[75] Inventors: Moises Cases; Satyajit Dutta; Fahd Hinedi, all of Austin, Tex.

[73] Assignee: International Business Machines Corporation, Armonk, N.Y.

[21] Appl. No.: 08/888,801

[22] Filed: Jul. 7, 1997

[51] Int. Cl.[6] .................................................. H02H 9/00
[52] U.S. Cl. .............................. 361/88; 361/56; 361/111; 361/119
[58] Field of Search .................................. 361/56, 58, 91, 361/111, 117, 118, 119, 88; 326/81, 83

[56] References Cited

U.S. PATENT DOCUMENTS 5,736,869  4/1998  Wei .............................................. 326/81

*Primary Examiner*—Jeffrey Gaffin
*Assistant Examiner*—Stephen Jackson
*Attorney, Agent, or Firm*—Casimer K. Salys; Alan L. Carlson; Andrew J. Dillon

[57] ABSTRACT

An output driver which maintains over voltage protection on individual circuit elements, providing either a level shifted logic high or a floating-state on its output. The output driver includes a latch driven by a set circuit and a reset circuit. The latch output drives an output stage which produces a level shifted logic high when the latch is set and a floating-state when the latch is reset. Minimal voltage is applied across individual circuit elements by supplying power in concurrent incremental voltage levels to the output driver.

16 Claims, 2 Drawing Sheets

VOLTAGE PROTECTED LEVEL SHIFTING OF CHIP DRIVER

BACKGROUND OF THE INVENTION

1. Technical Field

The present invention relates in general to interface circuitry for low voltage digital technologies and in particular to a level shifting output driver. Still more particularly, the present invention relates to an output driver which maintains minimal voltage stress on individual circuit elements.

2. Description of the Related Art

Efforts to decrease the size, increase the speed and reduce the power consumption of electrical circuits has created the need for low voltage silicon construction. Lower voltage requirements result in lower power consumption which complements battery powered, portable electronics.

Lower operating voltage also provides for faster circuits. The voltage applied across a semiconducting device is directly related to its maximum switching frequency. Lower operating voltages provide for faster switching rates. With advances in semiconductor fabrication techniques, the size of electronic devices has been reduced to the sub-micron level and the voltage requirements of those devices has been being reduced significantly. In a typical computer system, a processor is coupled through a system bus to other devices, such as a system memory, an input/output ("I/O") controller, and an application specific integrated circuit ("ASIC"). Relative to these other devices, the processor can be manufactured according to a more advanced semiconductor fabrication techniques utilizing thin semi-conductor junctions.

Microprocessor core fabrication technology is still evolving rapidly. Microprocessor fabrication technology is advancing at a much faster rate than fabrication technology of other devices. Device geometries within the core logic of microprocessors are shrinking and power supply voltages must be lowered to accommodate small device geometries. Current silicon technology, using CMOS transistors, has reduced the required junction threshold voltage to approximately zero volts. The current low voltage logic standards are 1.8 volts and 3.3 volts. Presently available ASIC, interface and support circuits have relatively high voltage requirements due to device geometries.

For example, it is possible for normal operating voltages in a microprocessor to range between zero volts and 1.8 volts, while normal operating voltages in the other devices range between zero volts and 3.3 volts. In such a situation, a logic 1 state is represented by 1.8 volts in the microprocessor and by 3.3 volts in the other devices. In either case, a logic zero state is represented by zero volts.

Presently in order to communicate a logic high state between the processor and other devices, system busses transfer a signal having 3.3 volts. For this reason, the processor includes driver circuitry for translating a 1.8 volt logic high signal from the core logic within the microprocessor into a 3.3 volt signal for communicating a logic high through the system bus. Likewise, the microprocessor includes driver circuitry for translating a 3.3 volt logic high signal from the system bus into a 1.8 volt logic high signal for use elsewhere within the microprocessor.

Microprocessor core logic which operates at 1.8 volts can be damaged when more than 2 volts is applied across any given device. It is therefore a challenge to design circuitry which can guarantee that each individual device within a microprocessor can withstand bus voltages exceeding 2 volts.

Known driver circuitry fails to translate voltages in a manner that avoids damage to its transistors under some circumstances, particularly when the processor's maximum voltage is substantially lower than the other devices' maximum voltage(s). For example, some fabrication techniques impose a relatively low predetermined limit on a maximum safe difference between a voltage at a transistor's gate and a voltage at a source/drain region of the transistor. In such a situation, if a transistor's source/drain region has a voltage that differs from a voltage at the transistor's gate by more than the predetermined limit, then the transistor's gate oxide could be damaged in a manner that destroys the transistor's operability.

Conventional output drivers perform sufficient level shifting but lack sufficient over voltage protection. Prior art devices have poor design margin which results in reliability problems. Particularly when power surges occur or power is turned on. Variations in supply voltage or power surges can over-stress junctions. This eventually leads to device failure. Most existing circuits add undue complexity, cost and unreliability to a system. Also, many external interface circuits slow the overall speed of the system and increase power consumption.

Another problem which may occur is loss of data because an output interface driver does not reach the proper threshold logic voltage at the required time. External compensation methods can also introduce incompatibility.

Presently, internal compensation methods for creating compatibility between logic level standards utilize higher voltage, thicker gate dimensions. Thus, a need has arisen for a method and circuitry for translating voltages, in which damage to a low voltage transistor is avoided, even if a maximum voltage of a first device (e.g. a processor) is substantially lower than a maximum voltage at a second device, and even if a relatively low predetermined limit is imposed on a maximum safe difference between a voltage at the transistor's gate and a voltage at a source/drain region of the transistor.

Hence, retaining functionality and optimum performance while reducing the maximum voltage which can possibly exist across an active element is desirable and advantageous. The present invention is directed at solving the incompatibility problem that exists between low voltage processor core technology and higher voltage I\O digital interface circuitry.

SUMMARY OF THE INVENTION

It is therefore one object of the present invention to provide a level shifting output driver.

It is another object of the present invention to provide a level shifting output driver utilizing low voltage digital circuitry with minimal power consumption.

It is yet another object of the present invention to provide a level shifting output driver implementing fast switching which maintains minimal voltage stress on individual circuit elements.

The foregoing objects are achieved as is now described. An output driver is provided which maintains over voltage protection on individual circuit elements, providing either a level shifted logic high or a floating-state on its output. The output driver includes a latch driven by a set circuit and a reset circuit. The latch output drives an output stage which produces a level shifted logic high when the latch is set and a floating-state when the latch is reset. Minimal voltage is applied across individual circuit elements by supplying power in concurrent incremental voltage levels to the output driver.

The above as well as additional objects, features, and advantages of the present invention will become apparent in the following detailed written description.

DETAILED DESCRIPTION OF THE DRAWINGS

Figure 1:
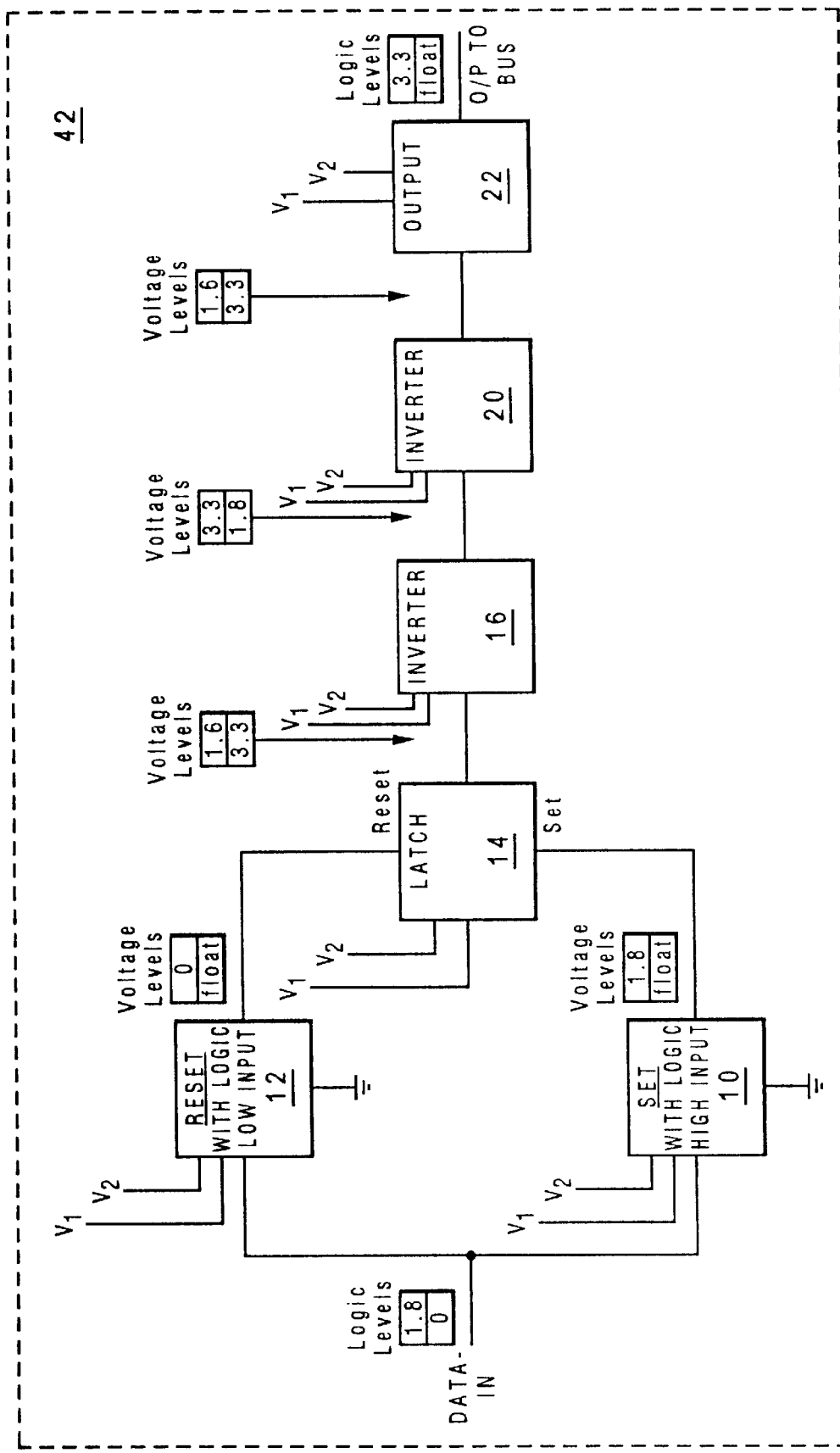
Figure 2:
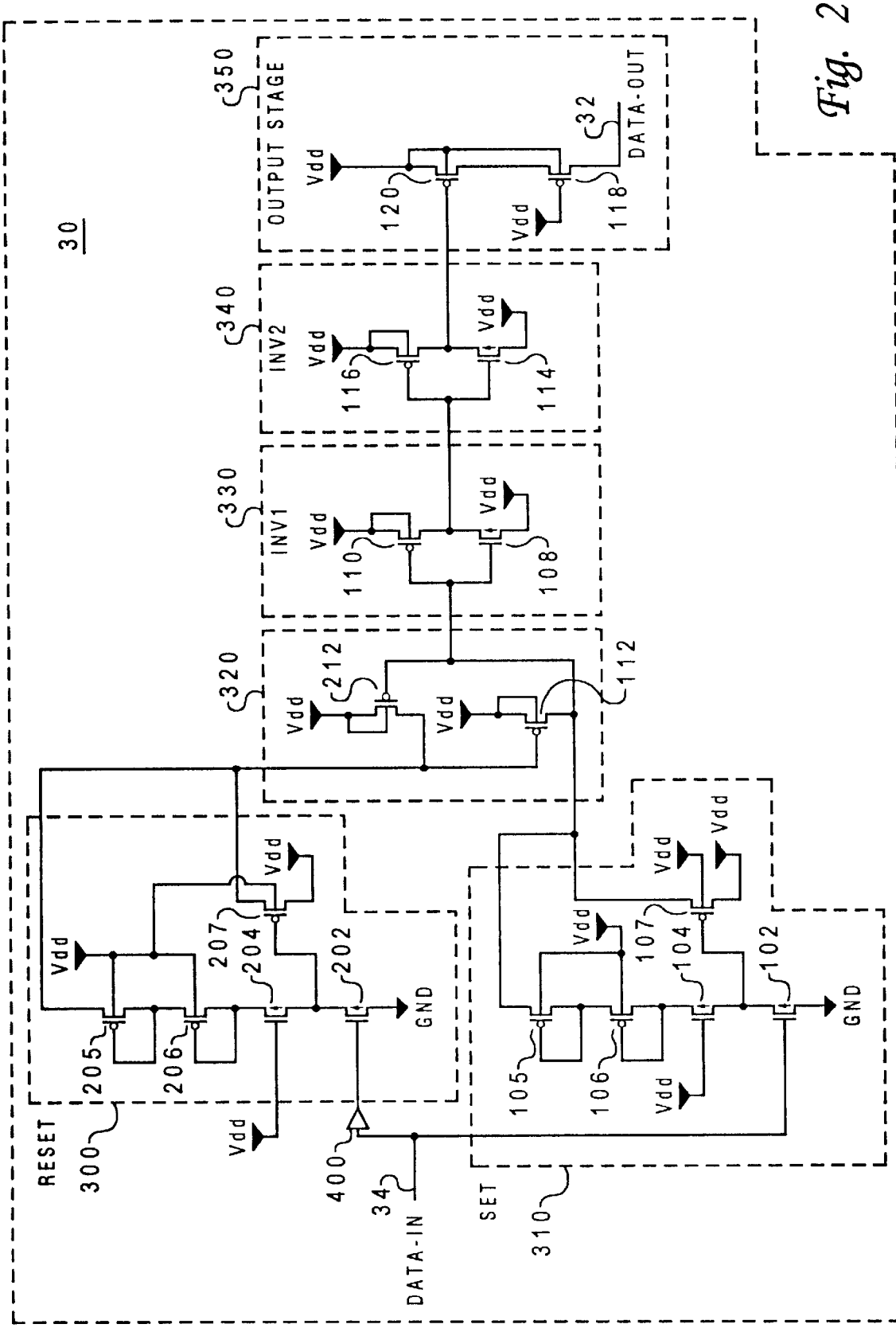

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 1 depicts a block diagram of a logic high output driver in accordance with the present invention; and FIG. 2 illustrates a more detailed diagram of the present invention detailing the concurrent incremental voltage supplied to the output driver.

DESCRIPTION OF PREFERRED EMBODIMENT

With reference now to the figures and in particular with reference to FIG. 1, a logic high output driver 22 is depicted. In a preferred embodiment the output driver 42 receives low voltage data from a microprocessor. However, output driver 22 would effectively operate for any circuitry which is not voltage compatible. Low voltage data is received by set circuit 10 and reset circuit 12. Set circuit 10 and reset circuit 12 are powered gradationally to allow for level shifting, without imposing a voltage across an active device which violates fabrication technology maximums. Specifically, power is supplied such that a predetermined maximum voltage is never present between the gate and drain or gate and source of a transistor. This is particularly important considering the thin gate oxide technology of modern circuits. Set circuit 10 and reset circuit 12 are supplied with V1 and V2 where, in a preferred embodiment V1=1.8 volts and V2=3.3 volts. Latch 14 receives the output of set circuit 10. Responsive to the set output, latch 14 produces approximately 1.6 volts on its output.

In a preferred embodiment the output of latch 14 drives a first inverter 16 which inverts the logic. First inverter 16 stabilizes the voltage of the logic signal, approximately at the supply voltage. A second inverter 20 is used to again invert the logic signal.

Output driver 22 receives the output of second inverter 20 and produces a level shifted logic high. Hence, the output driver 22 translates a received logic high voltage of 1.8 volts to a level shifted logic high of 3.3 volts on it's output.

In a preferred embodiment, output driver 22 is coupled to a bus for communicating data. Output driver 22, responsive to a level shifted logic low received on data-in, "floats" its output producing a "floating-state". When output driver 22 produces a "floating-state" it allows other driver circuits (not shown in FIG. 1) to drive the bus high or low without interference from the present invention.

A detailed embodiment in accordance with the present invention and its advantages are better understood by referring to FIG. 2 of the drawing. FIG. 2 is a schematic electrical circuit diagram of a preferred embodiment generally, for translating voltages according to the illustrative embodiment. A first supply voltage node Vdd has a voltage of approximately 1.8 volts (+or−∼5%) relative to a reference voltage denoted as GND. A second supply voltage node OVdd has a voltage of approximately 3.3 volts (+or −∼5%) relative to GND. In a preferred embodiment only two power supply voltages are utilized, however, additional concurrent incremental voltages could be utilized for level shifting to higher voltages. Each incremental increase in power supply voltage corresponds approximately to the maximum safe device voltage. Proper placement of devices or silicon junctions in combination with gradational increases in supply voltage prevents over-stress of each individual junction.

Driver circuit 30, indicated by dashed enclosure, receives data on data-in 34, and performs a voltage translation for a logic high. Driver circuit 30 produces an output on data-out 32. Data-out 32 communicates data to other system components (not shown in FIG. 2) or systems (also not shown in FIG. 2). During operation other devices may supply data over a bus which data-out 32 may be connected. Driver circuit 30 remains idle and does not affect the bus when a logic low is present on data-in 34 and hence, data-out 32 is in a "floating" state.

In a preferred embodiment, logic high over the bus is 3.3 volts and logic low is 0 volts. In a preferred embodiment, driver circuit 30 is supplied on data-in 34 by a microprocessor with a 1.8 volts core technology. However, driver circuit 30 could also be utilized anywhere logic level compatibility is desired.

Driver circuit 30 can be realized by a single integrated circuit integral with a microprocessor. Driver circuit 30 can be utilized to drive "off chip" devices. Stated another way, Driver circuit 30 may drive other systems or components not integrated on the same wafer where the driver circuit 30 resides. In a preferred embodiment, implementation is realized with metal oxide semiconductor ("MOS") field effect transistors "(FETs"). Accordingly, the MOSFETs are formed integrally with one another within integrated circuitry. Each such FET is a control device having a control node (e.g. a gate) and first and second conducting nodes (e.g. source/drain regions). Each such control device conducts electrical current between its two conducting nodes in response to a logic state of its control node.

Within driver circuit 30 each of transistors 108 and 114 has a threshold voltage ("Vt") of approximately 0 volts, so the transistor is substantially turned on in response to its gate voltage being above its source voltage. Each of transistors 102, 104, 106, 107, 202, 204, 206, and 207 has a Vt of approximately 0.4 volts, so the transistor is substantially turned on in response to its gate voltage being more than 0.4 volts above its source voltage. Each of transistors 105, 205 110, 112, 212, 116, 118 and 120 has a Vt of approximately 0.4 volts, so the transistor is substantially turned on in response to its gate's voltage being more than 0.4 volts below its source voltage.

Driver circuit 30 is comprised of a set circuit 310 and a reset circuit 300 each toggling a latch circuit 320. Latch circuit 320 drives first inverter 330 and first inverter 330 drives second inverter 340. Second inverter 340 then drives output stage 350 which supplies data-out 32 which may be connected to a bus.

Set circuit 310, indicated by dashed enclosure, is comprised of transistors 102, 104, 105, 106, and 107. Transistor 107 speeds the switching time from input to output of set circuit 310. Transistor 107 is not essential to the operation of set circuit 310. Transistor 107 can be removed if lower power consumption rather than a faster response time is desired. Transistors 105 and 106 function as diodes providing a voltage drop of approximately 0.8 volts between latch circuit 320 and the source of transistor 204.

Reset circuit 300, indicated by dashed enclosure, is comprised of transistors 202, 204, 205, 206, and 207. Transistors 205 and 206 function as diodes providing a voltage drop of approximately 0.8 volts between output of latch circuit 320 and transistor 104. Again, transistor 207 speeds the switching time from input to output and is not essential to the operation of driver circuit 30.

Latch circuit 320, indicated by dashed enclosure, is comprised of transistors 112 and 212. The latch circuit 320 is implemented to cut the quiescent power dissipation of set circuit 310 and reset circuit 300. A direct current ("DC") path is created between OVdd and ground, through transistors 102, 104, 105, and 106, responsive to data-in 34 having a voltage of approximately 1.8 volts, or a logic high. This DC path consumes a relatively high amount of power, because it continually conducts a significant amount of current while data-in 34 has a voltage of approximately 1.8 volts. After latch circuit 320 is set, transistor 105 shuts off terminating the current flow through set circuit 310. Likewise, responsive to data-in 34 having a voltage of approximately 0 volts, or logic low, a DC path through transistors 202, 204, 205, and 206 is created in reset circuit 300. After latch circuit 320 is reset, transistor 205 shuts off, terminating the current flow through reset circuit 300. Thus, latch circuit 320 reduces power consumption.

Inverter 330, indicated by dashed enclosure, is formed by transistors 108 and 110. Inverter 330 receives the output of latch circuit 320 and produces an inverted output to inverter 340. Inverter 330 buffers the latch output. For example, the latch output in one state is approximately 1.6 volts due to the voltage drop across transistor 107, while the corresponding output of inverter 330 is 1.8 volts.

Inverter 340, indicated by dashed enclosure, is formed by transistors 114 and 116. Inverter 340 receives the output of inverter 330 and produces an inverted output. The output of inverter 340 produces the same binary logic as the output of latch circuit 320 because the logic is twice inverted. However, the voltage at the output of latch circuit 320 is approximately 1.6 volts for a logic low and 3.3 volts for a logic high where, the output of inverter 340 is approximately 1.8 volts and 3.3 volts correspondingly.

Output stage 350, indicated by dashed enclosure, is formed by transistors 120 and 118. Output stage 350 receives the output of inverter 340. When inverter 340 supplies 3.3 volts to output stage 350, transistor 120 turns off and provides a "floating-state" on data-out 32. Tri-stating or "floating" allows other circuitry to provide a voltage at data-out 32 of up to 3.3 volts or to provide a ground on data-out 32, where the voltage falls to 0 volts. Data-out 32 is connected to other circuitry (not shown in FIG. 2) external to driver circuit 30.

In operation, a voltage at data-in 34 varies between approximately 0 volts and 1.8 volts, whereas a voltage at data-out varies between a "floating state" and approximately 3.3 volts. More particularly, driver circuit 30 translates a 0 voltage level at data-in 34 into a "floating" condition at data-out 32. Also, driver circuit 30 translates a 1.8 voltage level at data-in 34 into a steady-state 3.3 voltage level at data-out 32.

For example, if data-out 34 has a voltage of approximately 1.8 volts, then transistor 102 is substantially turned on because its gate's voltage is more than one Vt (i.e. ~0.4 volts for transistor 102) above its source's voltage (i.e. GND =~0 volts). Hereafter, the voltage present across the gate and source of a transistor will be referred to as "Vgs." When data-in 34 receives a voltage of approximately 1.8 volts, transistor 102 turns on. The voltage at the source of transistor 102 raises the gate voltage of transistor 107 above transistor's 107 drain voltage, such that transistor 107 is substantially turned on. When transistor 107 is substantially turned on, the voltage at the output of latch circuit 320 drops to approximately 1.6 volts (Vdd−Vt) or (2 volts−0.4 volts). Then, transistor 212 turns on since Vgs>0.4 volts and, it follows that transistor 112 shuts off since its Vgs<0.4 volts.

Next, inverter 330 receives 1.6 volts on the gates of transistors 110 and 108. Since transistor 108 has a source connected to Vdd (1.8 volts) Vgs<0.4 volts and transistor 108 shuts off. Therefore, the output of inverter 330 rises to 3.3 volts as transistor 110, which is supplied by OVdd, turns on.

Inverter 340 receives 3.3 volts on the gates of transistors 116 and 114. Since Vt=0 for transistor 114 and Vgs>or=zero volts, transistor 114 turns on. Inverter 340 provides an output of approximately 1.8 volts.

Output stage 350 receives 1.8 volts on the gate of transistor 120. Transistor 120 turns on because Vgs>0.4 volts. In this situation, data-out 32 is driven to 3.3 volts by transistor 118.

Alternately reset circuit 300 is activated by a logic low on data-in 34. In a preferred embodiment, an inverter 400 is placed between data-in 34 and transistor 202. Inverter 400 acts to separate activation of the set circuit 310 and the reset circuit 300 during transition of the logic level on data-in 34. Inverter 400 also acts to invert data-in 34 such that the reset circuit 300 is activated by logic low on data-in 34.

When a logic low or zero volts is applied to data-in 34, transistor 202 turns on lowering the gate voltage of transistor 207. Then transistor 207 turns on, lowering the voltage on the gate of transistor 112, which turns on transistor 112. Transistor 112 drives the output of latch circuit 320 to 3.3 volts.

Inverter 330 receives 3.3 volts on the gates of transistors 110 and 108. Transistor 108 has a source connected to 1.8 volts hence, Vgs>zero volts, and transistor 108 is turned on. Therefore, the output of inverter 330 falls to 1.8 volts.

Inverter 340 receives 1.8 volts on the gates of transistors 116 and 114. Transistor 114 turns off since Vgs<or=zero volts, providing an output of approximately 3.3 volts through transistor 116.

Output stage 350 receives 3.3 volts on the gate of transistor 120. In response to the output of inverter 340 having a steady-state voltage of ~3.3 volts, transistor 120 is substantially turned off because its gate's voltage is less than one Vt (i.e. ~0.4 volts for transistor 120) below its source's voltage (i.e. OVdd=~3.3 volts). In such a situation, data-out 32 has a tri-state "floating" condition. It is important to note that data-out 32 can swing from 3.3. volts to zero volts without violating junction voltage maximums.

By comparison, in response to the output of inverter 340 having a steady-state voltage of ~1.8 volts, transistor 120 is substantially turned on because its gate's voltage is more then one Vt below its source's voltage. This increases the voltage at the source of transistor 120 until its voltage is approximately 3.3 volts=OVdd. As the voltage at the source of transistor 120 increases above approximately 2.2 volts, transistor 118 is substantially turned on because its gate's voltage is more than one Vt below its source's voltage (i.e. the source of transistor 120>~2.2 volts). This increases the voltage at data-out 32 until its voltage is approximately equal to transistors 120 source voltage. In this manner, data-out's 32 voltage eventually increases along with source of transistor 120 voltage to a steady-state voltage of ~3.3 volts=OVdd.

In driver circuit 30, approximately 2.4 volts is the predetermined limit on a maximum safe difference between a voltage at a transistor's gate and a voltage at a source/drain region of the transistor. By varying the voltage at the output of latch circuit 320 between approximately 1.8 volts and 3.3 volts, driver circuit 30 advantageously ensures that no transistor's source/drain region has a voltage that differs from a voltage at the transistor's gate by more than the predetermined limit.

For example, the difference between transistor 212's source voltage (i.e. OVdd=~3.3 volts) and transistor 212's gate voltage (i.e. latch output=~1.8 volts to ~3.3 volts) is never more than approximately 1.5 volts. In this manner, driver circuit 30 achieves enhanced reliability as compared to previous techniques for translating voltages, because gate oxides of transistors in driver circuit 30 are less likely to be damaged.

In conclusion, the voltage at the output of latch circuit 320 varies between approximately 1.8 volts and 3.3 volts in responses to the voltage at data-in 32 varying between approximately 1.8 volts and 0 volts, respectively. In response to the output of latch circuit 320 having a steady-state voltage of ~1.8 volts, (1) the output of inverter 330 has a steady-state voltage of ~3.3 volts and (2) the output of inverter 340 has a steady-state voltage of ~1.8 volts. By comparison, in response to the output of latch circuit 320 having a steady-state voltage of ~3.3 volts, (1) the output of inverter 330 has a steady-state voltage of ~1.8 volts and (2) the output of inverter 340 has a steady-state voltage of ~3.3 volts.

In summary, driver circuit 30 translates (1) a steady-state 0 voltage at data-in 34 into a tri-state "floating" condition at data-out 32 and (2) a steady-state 1.8 voltage at data-in 34 into a steady-state 3.3 voltage at data-out 32. Advantageously, driver circuit 30 has been successfully tested.

While the invention has been particularly shown and described with reference to a preferred embodiment, it will be understood by those skilled in the art that various changes in form and detail may be made therein without departing from the spirit and scope of the invention.

What is claimed is:

1. An output driver apparatus which maintains over-voltage protection on individual circuit elements providing either a level shifted logic high output or a floating-state output comprising:
    a latch having a first input, a second input and an output;
    a set circuit having an output coupled to said first input of said latch, said set circuit for setting said output of said latch responsive to a logic high on said input of said set circuit;
    a reset circuit having an output coupled to said second input of said latch, said reset circuit resetting said output of said latch responsive to a logic low on said input of said reset circuit; and,
    an output stage circuit having an input coupled to said latch and an output for producing said level shifted logic high when said latch is set and said output of said output stage floating when said latch is reset, wherein minimal voltage is applied across said individual circuit elements by supplying power to said output driver utilizing concurrent incremental voltage levels.

2. The output driver according to claim 1, wherein said input of said set circuit is coupled to said input of said reset circuit.

3. The output driver according to claim 1, wherein said incremental voltage levels do not exceed approximately 1.8 volts.

4. The output driver according to claim 1, wherein said incremental voltage levels do not exceed approximately 2.0 volts.

5. The output driver according to claim 1, wherein a first incremental voltage is 1.8 volts and a second incremental voltage is 3.3 volts.

6. The output driver according to claim 1, wherein fabrication technology of said output circuit determines said incremental voltage levels.

7. The output driver according to claim 1, wherein said output of said latch is a level shifted logic.

8. The output driver according to claim 1, wherein a voltage level of said logic high is supply voltage dependent.

9. The output drivers according to claim 1, wherein a voltage level of said logic low is supply voltage dependent.

10. The output driver according to claim 1, comprising an inverter circuit receiving an input signal and providing said reset circuit with a delayed signal for stabilizing said output driver during transition of said input signal.

11. The output driver according to claim 1, comprising propagation enhancement element to speed the switching speed from input to output.

12. The output driver according to claim 1, wherein said latch reduces quiescent current required by said output driver circuit.

13. The output driver according to claim 1 wherein said latch reduces quiescent power consumption of said set circuit when said latch is set.

14. The output driver according to claim 1, wherein said latch reduces quiescent power consumption of said reset circuit when said latch is reset.

15. A voltage protected output driver receiving a logic signal and providing either a level shifted logic high output or a floating-state output comprising;
    a latch having a first input, a second input and an output;
    a set circuit having an output coupled to said first input of said latch, said set circuit for setting said output of said latch responsive to said logic signal;
    a reset circuit having an output coupled to said second input of said latch, said reset circuit resetting said output of said latch responsive to said logic signal;
    a first inverter for receiving said latch output, said first inverter for producing an output inverted from said latch output;
    a second inverter for receiving said output of said first inverter, said second inverter for producing an output inverted from said output of said first inverter; and
    an output stage circuit having an input coupled to said second inverter and an output for producing either said level shifted logic high or said floating-state responsive to said logic signal, wherein voltage protection is maintained on individual circuit elements by supplying power to said output driver utilizing concurrent incremental voltage levels.

16. The output driver according to claim 15, wherein a first incremental voltage is 1.8 volts and a second incremental voltage is 3.3 volts.

* * * * *

UNITED STATES PATENT AND TRADEMARK OFFICE
CERTIFICATE OF CORRECTION

PATENT NO. : 5,905,618
DATED : May 18, 1999
INVENTOR(S) : Cases et al.

It is certified that error appears in the above-identified patent and that said Letters Patent is hereby corrected as shown below:

Title page, Item [54] tile, delete "of" and insert -- off--.

Column 1, Line 2 delete "OF" and replace with --OFF--; and

Column 3, Line 22 delete "22" and replace with --42--.

Signed and Sealed this

Second Day of May, 2000

Attest:

Q. TODD DICKINSON

*Attesting Officer*      *Director of Patents and Trademarks*